Oct. 3, 1961 F. H. GERHARD 3,003,122

LOW LEVEL TRANSISTOR SWITCHING CIRCUIT

Filed March 21, 1958 4 Sheets-Sheet 1

INVENTOR.
FRANCIS H. GERHARD
BY Edward A. Scholes
AGENT

LOW LEVEL TRANSISTOR SWITCHING CIRCUIT

Filed March 21, 1958 4 Sheets-Sheet 2

INVENTOR.
FRANCIS H. GERHARD
BY Edward A. Schwolm
AGENT

INVENTOR.
FRANCIS H. GERHARD
BY
AGENT

INVENTOR.
FRANCIS H. GERHARD
BY Edward A. Sokolski
AGENT

United States Patent Office 3,003,122

Patented Oct. 3, 1961

3,003,122

LOW LEVEL TRANSISTOR SWITCHING CIRCUIT

Francis H. Gerhard, Lakewood, Calif., assignor to North American Aviation, Inc.

Filed Mar. 21, 1958, Ser. No. 723,035
14 Claims. (Cl. 332—9)

This invention relates to transistor switching circuits and more particularly to a transistor switching circuit especially suitable for use in modulating and demodulating low level signals without error signals being generated in the transistor.

A junction transistor of either the n-p-n or p-n-p type can be made to function as an imperfect switch. In this application, the collector and emitter electrodes of the transistor are the terminals of the switch. When a voltage is applied between the base and emitter electrodes of the transistor of such a polarity as to cause the emitter-base junction of the transistor to be reverse biased, the transistor is "cutoff." In this state, the transistor presents an essentially open circuit between its collector and emitter electrodes and the transistor switch is in the "open" state. Conversely, when the emitter-base junction is forward biased, the transistor presents essentially a short circuit between its collector and emitter electrodes and the transistor switch is in the "closed" state. The transistor will similarly operate as a switch with a switching voltage applied between the base and collector electrodes. Thus, a transistor functions as a switch which can be opened or closed by applying a switching voltage of the proper polarity between either the base and emitter or base and collector circuits.

An ideal mechanical switch will present a zero impedance across its terminals when the switch is closed and an infinite impedance across its terminals when the switch is open. Many mechanical switches are available which will perform satisfactorily for low as well as high level input signals. However, a transistor utilized in such a switching circuit has many advantages over a mechanical switch. These include greater reliability, higher speed of the switching operation, longer life, and smaller size, among others. For this reason the transistor switch is now widely used.

The transistor switch, however, has certain disadvantages which may make its use intolerable where the voltage being switched is of a very low magnitude. The most significant of these disadvantages in such an application is that the transistor does not appear as a completely passive element, i.e., the transistor switch generates currents and voltages which appear in significant proportions at its terminals. These voltages and currents are introduced when the transistor switch is in both the open and closed positions. The nature of these voltages and currents are discussed in an article by R. L. Bright entitled "Junction Transistors Used As Switches" which appeared in the March 1955 issue of the AIEE Proceedings (especially pp. 116–120).

In the "open" state, the transistor acts as a current generator. As is pointed out in the aforementioned article by Bright, this is attributable to internal transistor coupling between emitter and base and collector and base. The current generated by the transistor tends to vary greatly with temperature and can result in intolerable temperature variable errors in the output signals when the switch is used in a device such as a modulator or demodulator, especially where these output signals are of a very low magnitude. When dealing with low level modulating signals, it is desirable that a high input impedance be presented to these signals. As the attainment of a high input inpedance in such an application necessitates utilization of a high impedance in series with the transistor switch, even a small current generated during transistor cutoff periods will produce a significant error voltage across this impedance which, when compared with the low level modulating signals being switched, is intolerable. This is especially significant when dealing with signals in the order of a millivolt.

A second error voltage is generated when the transistor is in the keyed or closed switch state. When in the "closed" state, the transistor acts as a voltage generator, i.e., a voltage relatively independent of external circuit impedances appears across the transistor switching terminals. This voltage as explained in the Bright article is again attributable to internal transistor coupling between emitter and base and collector and base. While this voltage is insignificant as compared with relatively high level modulating signals, it may reach appreciable proportions when dealing with signals of the order of a millivolt. While this voltage is temperature dependent, its variation with temperature is small compared with the current variation in the open state. It is to be noted that normal signal current produces no significant voltage drop across the transistor.

The device of this invention provides a simple and effective way to eliminate both these error signals. This is accomplished when the transistor switch is keyed or in the closed state by providing an equal and opposite voltage to the error voltage generated which appears in series with the output signal. Where requirements are extremely stringent, means are available for providing such a compensating voltage which will vary with temperature changes. When the transistor switch is in the open state, means are provided for temporarily shorting the base to one of the other electrodes of the transistor, thus causing the transistor to operate as a diode and thereby substantially eliminating all current flow. It is to be noted that a silicon diode will not conduct to any significant degree when voltages under 0.65 volt are applied between cathode and anode. Most germanium diodes will not conduct significantly with voltages applied of a magnitude under 0.1 volt. Consequently, silicon and germanium transistors functioning as silicon and germanium diodes, respectively, will react accordingly. It has been found that this conversion means enables satisfactory operation of silicon transistor switches in modulators and demodulators for input voltages a little under plus or minus .65 volt with input impedances of up to 1 megohm. Modulators using germanium transistor switches and having input voltages to be switched of a little below plus or minus .01 volt will satisfactorily operate with input impedances of up to 15 kilohms. The device of this invention therefore enables satisfactory transistor operation in circuits such as modulators and demodulators having relatively high input impedances without significant voltage errors in the output.

It is therefore an object of this invention to provide an improved transistor switching circuit.

It is a further object of this invention to provide a transistor switch in which the effects of transistor internally generated currents and voltages are effectively eliminated.

It is a still further object of this invention to provide an improved transistor switch for handling low level voltages.

It is another object of this invention to eliminate voltage errors in a transistor switching circuit.

It is still another object of this invention to provide a transistor switch for use in a low level modulator which will have substantially zero volts output when the switch is closed and a voltage which is a direct function of the modulating voltage when the switch is open.

Other objects of this invention will become apparent from the following description when taken in connection with the accompanying drawings, in which FIG. 1 is a schematic diagram of a first embodiment of the invention in which provision is made for correction of error signals internally generated during transistor non-conduction only;

Figure 8:
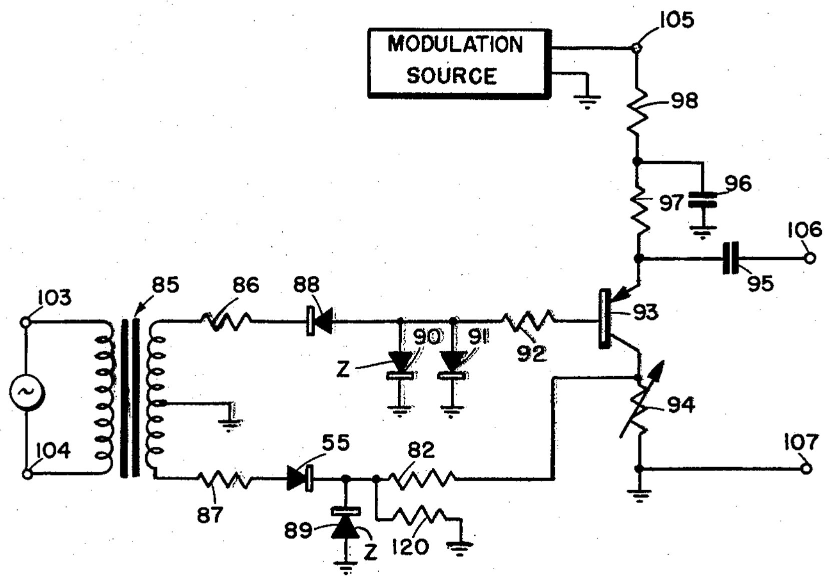

And FIG. 8 is a schematic diagram of a seventh embodiment of the invention incorporating error signal correction during transistor conduction and non-conduction.

Figure 1:
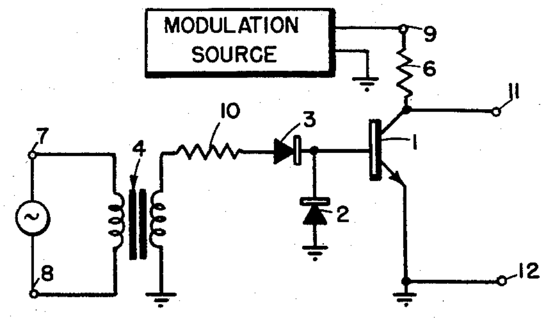

Referring to FIG. 1 which is a schematic of a first embodiment of the invention providing error signal correction only during the transistor non-conducting state, an input carrier signal, preferably a square wave which will drive the transistor 1 to saturation, is fed in at terminals 7 and 8 through transformer 4 to one side of current limiting resistor 10. The other side of resistor 10 is connected to the anode of diode 3, the cathode of this diode being connected to the base of n-p-n transistor 1. The cathode of a second diode 2 is connected to the base of transistor 1, the anode of diode 2 being connected to ground. The emitter of transistor 1 is connected to ground. The signal to be switched is connected between terminals 9 and 12. Input resistor 6 is connected between terminal 9 and the collector of transistor 1. Output terminal 11 is connected to the collector of transistor 1 and output terminal 12 is connected to ground.

The circuit herein shown is a basic modulator with the carrier voltage fed in at terminals 7 and 8 and the modulating voltage fed in between terminals 9 and 12. The output signal appearing between terminals 11 and 12 will comprise an alternating-current signal of a magnitude and phase which is a function of the instantaneous value of the modulating voltage and having a frequency equal to that of the alternating-current switching voltage fed in at terminals 7 and 8. As diode 3 will only effectively pass the positive half cycle of the alternating voltage fed from transformer 4, the base of transistor 1 will receive such positive voltages and the transistor will conduct during this half cycle. During the negative half cycle of the alternating switching voltage, transistor 1 will see a negative potential between its base and its emitter due to the leakage resistance of imperfect diode 3. Consequently, the base-to-emitter junction will be back-biased and there will be substantially no conduction through transistor 1. However, as pointed out supra, there always is some small leakage current in transistors when the base emitter junction is back-biased which causes the transistor to appear as a current generator between terminals 11 and 12. This small current could cause a potential drop across input resistor 6 of a sufficient magnitude to significantly vary the output voltage level between terminals 11 and 12 from what this level would be as a function of the modulating voltage alone.

Diode 2 functions to substantially eliminate such leakage current during the transistor non-conducting state. The negative voltage appearing at the anode of diode 3 will also appear between the cathode and anode of diode 2. This will cause diode 2 to conduct, effectively providing a low impedance path between the base and emitter of transistor 1, thus eliminating the reverse biasing voltage between these two elements. This, in effect, causes the transistor to appear as a passive diode. As is well-known in the art, a silicon diode will not conduct to any significant degree unless there is at least .65 volt between its anode and cathode. The same is true for germanium diodes with voltages under .01 volt. Consequently with modulating voltages of under plus or minus .65 volt for silicon transistors and under plus or minus .01 volt for germanium transistors, the diode converted transistor will not conduct significantly during negative half cycles of the switching signal. In this manner, the leakage current which caused an error voltage to appear across input resistor 6 is effectively eliminated . It is to be noted that absolutely all current flow is not eliminated, but it is so substantially minimized that it has been found that for most applications resistor 6 can have a reasonably high impedance. Experimentation indicates that with silicon transistors an input resistor 6 of up to 1 megohm can be utilized in an accurate low level modulator with modulation voltages of from 1 to 500 millivolts, while with germanium transistors, resistor 6 can be up to about 15 kilohms utilizing modulating voltages of from 1 to 10 millivolts. Diode 2 preferably should be a high conductance germanium type while diode 3 preferably a good silicon type having a high back resistance.

This same circuit will function as a demodulator in which case the input is a carrier suppressed signal fed in across terminals 9 and 12, the switching voltage as before is fed between terminals 7 and 8, and the output signal appearing between terminals 11 and 12 is a rectified version of the input signal. To obtain a true reproduction of the modulating voltage, an appropriate filter can be included in the output circuitry to filter out the carrier switching voltage which will be of higher frequency.

It should also be noted that although the switching voltage is applied between the base and emitter of transistor 1 in FIG. 1, the switch will function in the same manner if this voltage is instead applied between the base and collector. The emitter and collector terminals of the transistor may therefore be interchanged without changing the operation of the circuit. This also holds true for the remaining embodiments of the invention.

Figure 2:
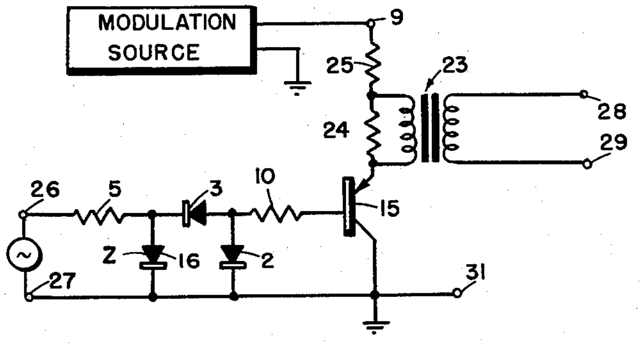
FIG. 2 is a schematic diagram of a modified version of the embodiment shown in FIG. 1.

Referring now to FIG. 2, a modified version of the embodiment of FIG. 1 is shown. This version utilizes a p-n-p transistor 15 rather than the n-p-n type utilized in the version of FIG. 1. Either type of transistor can be utilized in all the embodiments of the invention, but the circuitry must be modified to change polarity of diode connections as indicated by the differences between these connections as shown in FIG. 1 and FIG. 2. In the version shown in FIG. 2, the input transformer 4 has been eliminated and an input regulating circuit comprising resistor 5 and zener diode 16 are utilized. This regulating circuit limits the alternating-current switching signal fed between input terminals 26 and 27 to a desired amount as application demands dictate and tends to keep the output more constant. As is well-known in the art, a zener diode will break down in the backward direction and maintain the voltage constant across its electrodes during this conduction state.

In this version, the negative half cycles of the alternating-current switching voltage input will cause transistor 15 to conduct while the positive half cycles will substantially bring the transistor to its cutoff condition. During the positive half cycle cutoff condition state we would normally have leakage current in transistor 15 which would provide an error voltage in the output. However, similarly to the embodiment shown in FIG. 1, diode 2 will conduct during these positive half cycles providing a low impedance path through relatively low impedance resistor 10 between the base and collector of transistor 15, effectively causing the transistor to function as a diode. This, as explained above, will effectively eliminate all significant current generation in transistor 15 during its so-called cutoff condition. In the version of FIG. 2, the output is taken from transformer 23 at output terminals 28 and 29. Resistor 10 has been added to limit current flow due to zener diode 16. Terminals 9 and 31 are utilized to couple the modulating voltage input. Resistors 24 and 25 are utilized for current limiting.

The embodiments shown in FIGS. 1 and 2 do not provide correction for the error voltage generated by the transistor during conduction. However, this error is not as serious as that occurring during transistor cutoff, and the embodiments of FIGS. 1 and 2 will function adequately where application demands are not so stringent as to require any additional correction.

Figure 3:
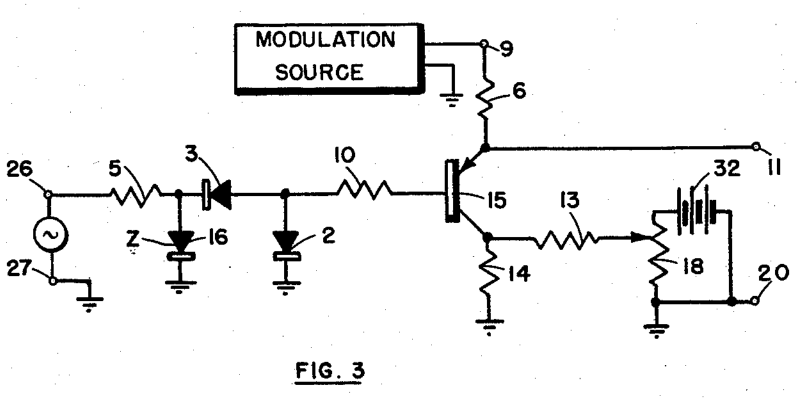
FIG. 3 is a schematic diagram of a second embodiment of the invention in which correction is made for error signals internally generated during both conduction and non-conduction transistor states.

FIG. 3 is a schematic diagram of a second embodiment of the invention incorporating error signal correction in both transistor conducting and non-conducting states. This embodiment is shown utilizing a p-n-p type transistor, but could readily be adapted for use with an n-p-n type by inverting diode connections and following the general arrangement shown in FIG. 1. Also, the collector and emitter terminals may be interchanged without affecting the operation of the circuit. The circuitry herein shown from the switching voltage terminals 26 and 27 to the base of transistor 15 is the same as that shown in FIG. 2. The modulating voltage input is fed between terminals 9 and 20. Terminal 9 is connected to the transistor emitter through resistor 6 and terminal 20 is connected to ground. This circuit functions identically to that described for the embodiment of FIG. 2 during transistor non-conduction. However, the additional feature of error signal correction during transistor conduction is incorporated as well. This feature is provided by the circuitry comprising resistors 13 and 14, direct-current source 32, and potentiometer 18. Resistor 14 is connected between the collector of transistor 15 and ground. Resistor 13 is connected between the collector of transistor 15 and the variable arm of potentiometer 18. One side of potentiometer 18 is connected to ground. The other side of this potentiometer is connected to the positive terminal of direct-current source 32. The negative terminal of the direct-current source is connected to ground. Potentiometer 18 is adjusted to give a voltage equal and opposite to the voltage generated in transistor 15 when this transistor is conducting. This voltage appears across resistor 14 in the series output circuit of the transistor. Consequently, the output voltage which is taken between terminals 11 and 20 will, during the conducting state of transistor 15, be equal to the voltage drop between the transistor emitter and collector plus the voltage drop across resistor 14. If this second voltage drop is equal and opposite in polarity to the first, the net voltage between terminals 11 and 20 will be zero during the transistor conducting state. It is to be noted that for an n-p-n type transistor, the polarity arrangement of direct-current source 32 should be the opposite of that shown for a p-n-p type.

The most serious error signal is generated in the transistor non-conducting state and the embodiment illustrated in FIGS. 1 and 2 will suffice for many applications. The embodiment shown in FIG. 3 can be utilized where application demands dictate more effective elimination of error signal to encompass periods of transistor conduction as well as non-conduction.

Figure 4:
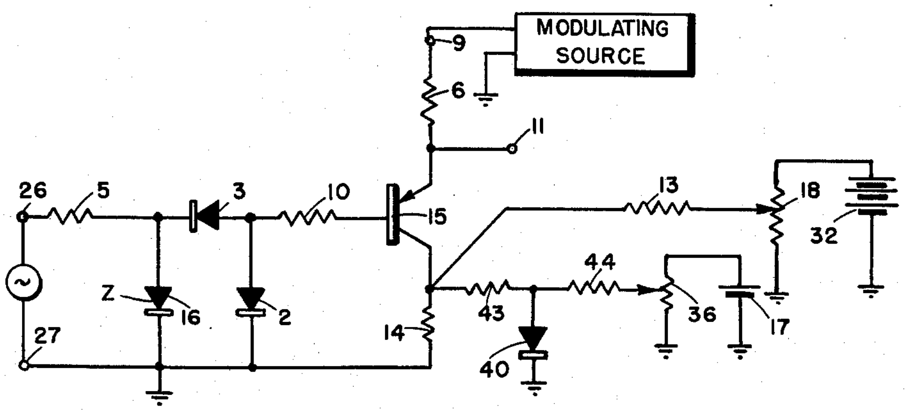
FIG. 4 is a schematic diagram of a third embodiment of the invention similar to that shown in FIG. 3 in which correction is made for internally generated error signals during transistor conduction and non-conduction states and additionally incorporating temperature compensation features.

FIG. 4 is a schematic diagram of a third embodiment of the invention similar to that shown in FIG. 3 and additionally incorporating temperature compensation for error voltage correction during transistor conduction. This is accomplished by the circuitry comprising resistors 43 and 44, potentiometer 36, diode 40, and direct-current source 17. Diode 40 should be chosen to have a temperature voltage characteristic similar to that of transistor 15. Current will flow at all times from current source 17 through potentiometer 36, resistors 44, 43, 14, and diode 40. The voltage across diode 40 will vary with changes in its conductivity with temperature variations. This will produce a proportionally variable voltage drop across resistor 14. The arm of potentiometer 36 can be adjusted to change the slope of the graphical plot of the variable voltage drop across resistor 14 vs. temperature to match it exactly to the transistor temperature characteristic. In this manner, the temperature dependent portion of the voltage generated within the transistor can be compensated for. Potentiometer 36 should be adjusted experimentally to a position which will keep the error signal constant with varying temperatures. Once potentiometer 36 has been so adjusted, potentiometer 18 should be adjusted to cancel the non-temperature-dependent portion of the error signal. In this manner, a voltage equal and opposite to the error voltage generated in the transistor during its conduction state can be made to appear across resistor 14 in series with the output signal so as to cancel out this error voltage. This embodiment can be used to special advantage where error signal elimination requirements are especially stringent.

Figure 5:
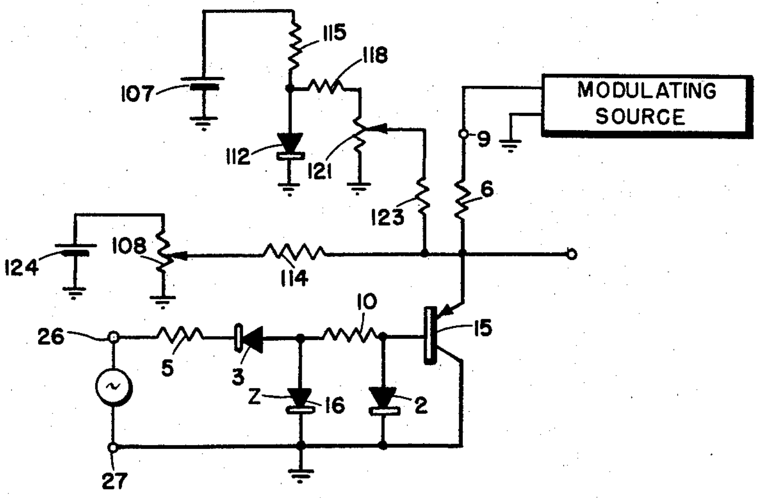
FIG. 5 is a schematic diagram of a fourth embodiment of the invention in which error signal correction is made during transistor conduction and non-conduction states and temperature compensation features are incorporated.

FIG. 5 is a schematic diagram of a fourth embodiment of the invention similar in function to that of FIG. 4, but incorporating error signal correction for the transistor conduction state in the emitter circuit rather than the collector circuit.

The circuitry from the input terminals 26 and 27 to the base and collector of transistor 15 is the same as that for the embodiment of FIG. 4, except that the anodes of diodes 16 and 2 are respectively connected to either end of resistor 10 rather than either side of anode 3. Either type of connection may be used in this embodiment, the choice of connections only slightly affecting operation and dependent on special design considerations. This part of the circuitry functions during transistor "cut-off" to cause the transistor to operate as a diode as previously explained.

The emitter circuitry comprising resistors 123, 118, 114 and 115, potentiometers 121 and 108, diode 112, and direct-current sources 107 and 124 effectively cancel the error voltage generated by the transistor during its conduction state. This circuitry functions similarly to the collector circuitry described for the embodiment of FIG. 4. The arm of potentiometer 121 can be adjusted to compensate for the temperature variable portion of the error voltage (similarly to the adjustment of potentiometer 36 described for the embodiment of FIG. 4). Potentiometer 121 may then be adjusted to cancel the non-temperature dependent portion of the error signal (similarly to the adjustment of potentiometer 18 described for the embodiment of FIG. 4).

Figures 6, 7:
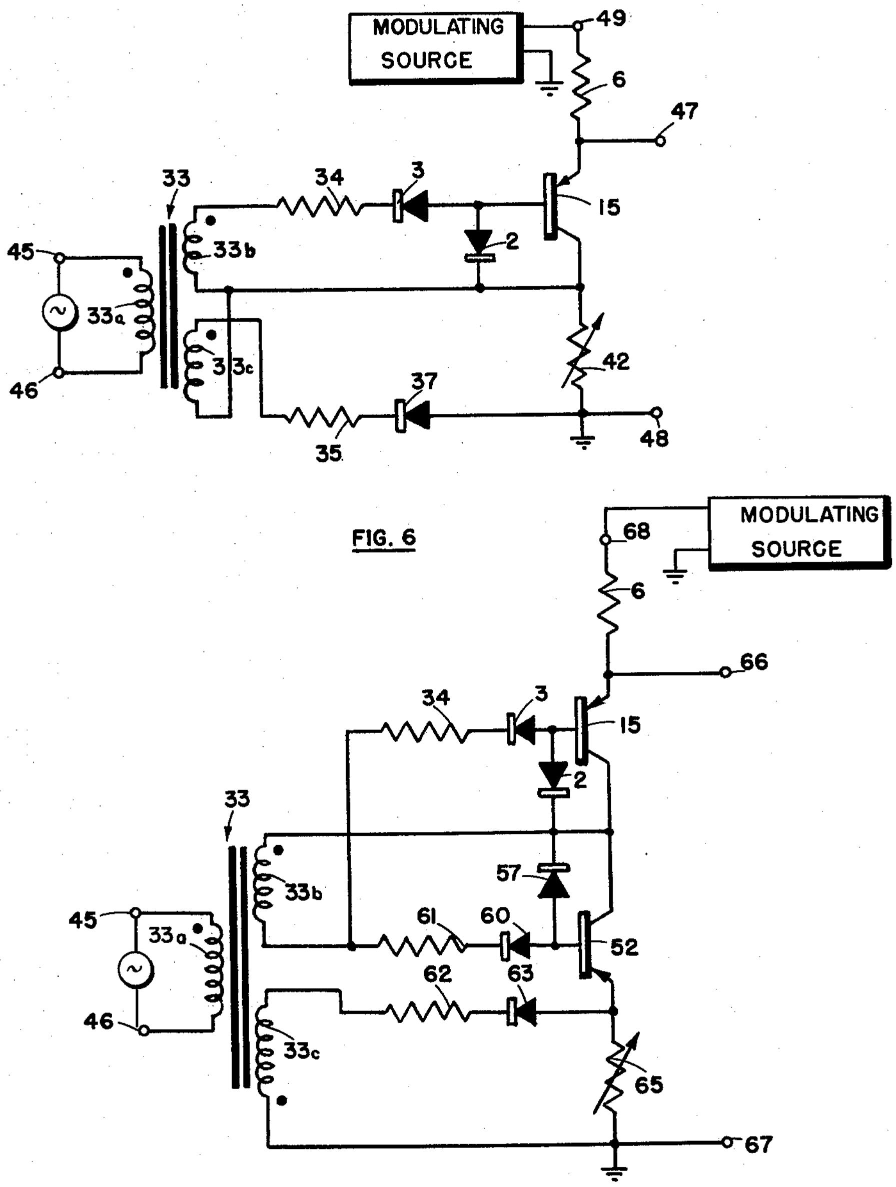
FIG. 6 is a schematic diagram of a fifth embodiment of the invention in which error signal correction is made during transistor conduction and non-conduction states.
FIG. 7 is a schematic diagram of a sixth embodiment of the invention in which the features of the embodiment shown in FIG. 6 are utilized and temperature compensation is incorporated.

FIG. 6 is a schematic diagram of a fifth embodiment of the invention incorporating error signal correction during both conduction and non-conduction transistor states. A switching voltage which is preferably a square wave which will drive transistor 15 into saturation is fed in at terminals 45 and 46 to primary 33*a* of transformer 33. Transformer 33 has two secondary windings 33*b* and 33*c*. The signal is fed from secondary 33*b* through current limiting resistor 34 and diode 3 between the base and collector of transistor 15. The cathode of diode 3 is connected to resistor 34 and its anode to the transistor base. The anode of diode 2 is connected to the base of transistor 15. The cathode of diode 2 is connected to the common connection between one end of winding 33*b* and the collector of transistor 15. One end of winding 33*c* having an in-phase relationship with the end of winding 33*b* connected to resistor 34 is connected through resistor 35 to the cathode of diode 37, the anode of diode 37 being connected to ground. The other end of winding 33*c* is connected to the collector of transistor 15. Variable resistor 42 is connected between the collector of transistor 15 and ground. Input modulating signals are connected between terminals 49 and 48. Terminal 49 is connected through resistor 6 to the emitter of transistor 15. Output terminals 47 and 48 are connected to the emitter of the transistor and ground, respectively.

The input alternating-current switching voltage, when of a negative polarity appearing across winding 33*b* and at the cathode of diode 3, will be coupled through this diode between the base and collector of transistor 15. As this transistor is a p-n-p type, it is caused to be in the conduction state by such a negative signal. An output voltage will appear between terminals 47 and 48 which is the sum of the voltage drop between the emitter and the collector of the transistor and the voltage drop across variable resistor 42. At the same time, a negative signal is fed across variable resistor 42 through resistor 35 and diode 37 from winding 33*c*. The polarity of the resulting voltage across variable resistor 42 is such that it is positive at the connection of the variable resistor to the transistor collector with respect to ground. The voltage generated within the transistor is such that the emitter has a negative potential with respect to the collector. Variable resistor 42 can be adjusted so that the voltage drop across it is equal to that across the transistor. The sum of these two oppositely polarized voltages will appear as a zero voltage between output terminals 47 and 48.

When the transistor is cut off, diode 2 converts the transistor into a diode as explained for the previous embodiments, thereby effectively minimizing leakage currents.

This circuit has advantages over that shown in FIG. 3 in that the correcting voltage developed across variable resistor 42 is not present during the "open" or non-conducting state of transistor 15. The presence of this voltage during non-conduction may be troublesome where a transistor having a low leakage resistance is used, such as some germanium types. The embodiment of FIG. 6 can be used in such a situation to eliminate this difficulty. Also, while the circuit shown in FIG. 6 requires a transformer having two secondary windings, it does not require the direct-current source 32 indicated in FIG. 3.

FIG. 7 is a schematic diagram of a modified version of the embodiment shown in FIG. 6 which while incorporating all of the basic features shown in FIG. 6, also incorporates temperature compensation which is primarily effective for correction during transistor conduction. As can be seen, two transistors are required. The switching voltage is applied between terminals 45 and 46 to the primary winding 33*a* of transformer 33. These signals are coupled respectively to secondary windings 33*b* and 33*c*. One end of winding 33*b* is fed to the collectors of transistors 15 and 52. The cathodes of diodes 2 and 57 are connected to this common connection. The other end of winding 33*b* is connected through resistor 34 to the cathode of diode 3, the anode of this diode being connected to the base of transistor 15. The anode of diode 2 is connected to the base of transistor 15. Modulating voltage input terminal 68 is connected through input resistor 6 to the emitter of transistor 15. Output terminals 66 and 67 are connected between the emitter of transistor 15 and ground, respectively. The common connection between winding 33*b* and resistor 34 is connected through resistor 61 to the cathode of diode 60, the anode of this diode being connected to the base of transistor 52. The anode of diode 57 is connected to the base of transistor 52. One end of secondary winding 33*c* is connected to ground. The other end of this winding is connected through resistor 62 to the cathode of diode 63, the anode of this diode being connected to the emitter of transistor 52. Variable resistor 65 is connected between the emitter of transistor 52 and ground. The polarity relationships of windings 33*b* and 33*c* are arranged such that the bottom end of winding 33*b* connected to resistors 34 and 61 has an in-phase relationship with the top end of winding 33*c* connected to resistor 62.

A negative switching voltage appearing at the bottom end of winding 33*b* will be coupled through diodes 3 and 60 and will cause transistors 15 and 52 to conduct. The output voltage appearing between terminals 66 and 67 will be the sum of the voltage drops across transistors 15 and 52 and variable resistor 65. The transistors are arranged in series, one inverted with respect to the other. Consequently, the output voltage will be the difference between the voltage drop generated within each transistor plus the drop across variable resistor 65. If the transistors are chosen to have identical generated voltages, these will cancel each other out and with resistor 65 set to zero, the output will be zero. Such a condition is difficult to achieve in practice and some voltage must generally be introduced across resistor 65 to achieve a null condition. It is to be noted that the transistors must always be arranged so that transistor 52 has a higher internally generated voltage than transistor 15, as in the arrangement shown, only a negative voltage additive to the drop across transistor 15 can be introduced across variable resistor 65 to give a zero output. The voltage drop across variable resistor 65 is developed by current flow from transformer winding 33*c* through resistor 62, diode 63, and the variable resistor during transistor conduction. If the transistors are chosen to have similar voltage temperature characteristics, the voltage generated within each transistor will vary concommitantly with temperature changes and will tend to maintain a constant voltage difference which will be cancelled by the voltage drop across variable resistor 65.

Referring now to FIG. 8, a seventh embodiment of the invention incorporating both error signal correction during transistor conduction and non-conduction is shown. A switching voltage, preferably a square wave which will drive transistor 93 to saturation, is fed between terminals 103 and 104. Transformer 85 has a center tapped secondary, this center tap being grounded to afford balanced operation. One end of the secondary of transformer 85 is connected through resistor 86 to the cathode of diode 88. The anode of diode 88 is connected through current limiting resistor 92 to the base of transistor 93. Two diodes, 90 and 91, are paralleled, the anodes of these diodes being connected to the anode of diode 88, their cathodes being connected to ground. Diode 90 should preferably be a zener diode. The other end of the transformer secondary winding is connected through resistor 87 to the anode of diode 55, the cathode of this diode being connected through resistor 82 to the collector of transistor 93. Diode 89, preferably a zener diode has its cathode connected to the cathode of diode 55 and its anode connected to ground. Resistor 120 is connected across the diode. The collector of transistor 93 is connected through variable resistor 94 to ground. Modulating input signals are connected between terminals 105 and 107. Terminal 105 is connected through resistors 98 and 97 to the emitter of transistor 93. The emitter of transistor 93 is additionally connected through capacitor 95 to output terminal 106. Capacitor 96 is connected between the connection of resistors 97 and 98 and ground. Output signals are taken from terminals 106 and 107.

The switching voltage, when of a negative polarity at the top of transformer 85 secondary with respect to ground, is fed through diode 88 and resistors 86 and 92 between the base of transistor 93 and ground, closing the transistor switch. Similarly to that in the previously shown embodiments, an output voltage will appear between terminals 106 and 107 which will be substantially the sum of the voltage between the emitter and collector of transistor 93 and across resistor 94, coupling capacitor 95 having negligible impedance at the switching frequency. The voltage drop across resistor 94 must be made equal and opposite to the voltage drop across the transistor to provide zero voltage between terminals 106 and 107 as desired. This is accomplished as follows: A positive signal appears at the bottom of the secondary of transformer simultaneously with the appearance of a negative transistor switching voltage at the top of this secondary. This positive signal causes a current flow through resistor 87, diode 55, resistor 82, and variable resistor 94 to ground. This will result in a voltage drop across variable resistor 94 which is opposite in polarity to the voltage generated in transistor 93. The magnitude of the voltage drop across variable resistor 94 can be adjusted by varying its resistance until this voltage drop is exactly equal to the voltage generated within the transistor. Zener diode 89 maintains the voltage applied to the correction circuit constant during transistor conduction states assuring a constant voltage across resistor 94 at this time. In this manner, the output between terminals 106 and 107 is kept at zero during the transistor conduction state.

During the positive half cycle of alternating-current switching signals, a positive voltage will appear across diode 91 causing this diode to conduct, effectively making transistor 93 operate as a diode. The functioning of the circuit under these conditions is the same as that explained for previous embodiments. Diode 90 is preferably a zener diode to regulate the input voltage and thereby regulate the conduction of transistor 93 to assure uniform output. Capacitor 96 is a filter for bypassing transients which might appear in the input due to outside influences. Capacitor 95 is an output coupling capacitor to isolate the output circuit from any direct-current voltages present in the load. This circuit has the advantage over the embodiment shown in FIG. 6 in that since the two output voltages of the transformer are referenced to ground, the same transformer may be used to supply more than one modulator.

Typical component values for all embodiments might be as follows:

| | |
|---|---|
| Resistors 24 and 25 | 5.1 kilohms. |
| Resistors 10, 34 and 61 | 13 kilohms. |
| Resistors 5 and 86 | 3 kilohms. |
| Resistor 6 | 500 kilohms. |
| Resistor 14 | 2 ohms. |
| Resistors 13, 35 and 62 | 7.5 kilohms. |
| Resistor 92 | 33 kilohms. |
| Resistor 87 | 10 kilohms. |
| Resistor 82 | 7 kilohms. |
| Resistors 97 and 98 | 240 kilohms. |
| Resistors 43, 44 and 115 | 500 ohms. |
| Resistors 120 and 118 | 100 kilohms. |
| Resistors 114 and 123 | 10 megohms. |
| Potentiometers 18 and 108 | 5 kilohms. |
| Potentiometer 36 | 1 kilohm. |
| Potentiometer 121 | 10 kilohms. |
| Variable Resistors 42, 65 and 94 | 2 ohms. |
| Transformer 33 | 1:1 turns ratio, double secondary. |
| Transformers 4 and 23 | 1:1 turns ratio. |
| Transformer 85 | 1:1 turns ratio, center tapped secondary. |
| Diodes 3, 37, 60 and 63 | Type 1N456. |
| Diodes 2, 57, 64 and 91 | Type 1N315. |
| Diodes 16, 90 and 89 | Type SZ9. |
| Diode 39 | Type 1N98. |
| Diode 88 | Type HD6005. |
| Diodes 40 and 112 | Type SG22. |
| Transistor 1 | Type 909. |
| Transistors 15 and 52 | Type CK791. |
| Transistor 93 | Philco type T1025. |
| Capacitors 95 and 96 | .0033 microfarad. |
| Direct-current source 32 | 10 volts. |
| Direct-current sources 17 and 107 | 1.3 volts. |
| Direct-current source 124 | 40 millivolts. |

The device of this invention has been found very useful in critical applications where very low level positive and negative signals must be used to modulate an alternating-current carrier. As has been pointed out, the slightest amount of voltage in the output caused by active elements in the transistor switch might, in such applications, be intolerable. This invention provides a simple and reliable means for overcoming this problem.

It is to be noted that in any of the embodiments shown either a p-n-p type or n-p-n type transistor can be utilized, the polarity of the diodes being varied as illustrated in the embodiments shown using p-n-p or n-p-n type transistors. It is further to be noted that the collector and emitter leads of the transistors may be reversed from the positions illustrated in the embodiments without changing the basic function of the invention.

Although the invention has been described and illustrated in detail, it is to be clearly understood that the same is by way of illustration and example only and is not to be taken by way of limitation, the spirit and scope of this invention being limited only by the terms of the appended claims.

I claim:

1. In a low level switching circuit, a transistor having emitter, collector, and base electrodes, an alternating-current switching voltage source, a low level signal source connected intermediate said emitter and collector electrodes, and means for making said transistor conductive in response to one predetermined half cycle of said switching voltage and cutting off all significant current flow in said transistor as compared with said low level signal source in response to the other half cycle of said switching voltage.

2. In a switching circuit, an electronic valve having electron collecting, electron emitting, and control electrodes, an alternating-current switching voltage source, a signal source connected intermediate said electron collecting and electron emitting electrodes, means for making said valve conductive in response to one predetermined half cycle of said switching voltage and substantially cutting off all current flow in said valve in response to the other half cycle of said switching voltage, and means for developing a voltage equal and opposite to the voltage drop between said electron collecting and electron emitting electrodes during the conductive period of said valve, said developed voltage appearing in series circuit with one of said electron collecting and electron emitting electrodes and said signal source.

3. In a switching circuit, a transistor having emitter, collector, and base electrodes, an alternating-current switching voltage source, a signal source connected intermediate said emitter and collector electrodes, said transistor being conductive in response to one predetermined half cycle of said switching voltage, and means for developing a voltage substantially equal and opposite to the voltage drop between said emitter and collector electrodes during the conductive period of said transistor, said developed voltage appearing in series circuit with one of said emitter and collector electrodes and said signal source.

4. In a switching circuit, an electronic valve having electron collecting electron emitting, and control electrodes, a signal source connected intermediate said electron collecting and electron emitting electrodes, an alternating-current switching voltage source, means for permitting said valve to conduct in response to one half cycle of said switching voltage, and means for providing a low impedance path between said control electrode and one of said other electrodes in response to the other half cycle of said switching voltage.

5. The device recited in claim 4 in which said means for permitting said valve to conduct and said means for providing a low impedance path comprise diodes..

6. In a switching circuit, an electronic valve having electron collecting, electron emitting, and control electrodes, a signal source connected intermediate said electron collecting and electron emitting electrodes, an alternating-current switching voltage source, means for low impedance coupling one half cycle of said switching voltage to and blocking the other half cycle of said voltage from said control electrode, and means for providing a low impedance path between said control electrode and one of said other electrodes in response to said other half cycle of said switching voltage.

7. In a switching circuit, a transistor having an emitter, collector, and base, a signal source connected intermediate said emitter and collector, circuit means for coupling an alternating-current switching voltage intermediate said base and collector, a first unidirectional current valve having high back resistance connected intermediate said coupling circuit means and said base, said valve being polarized to couple one predetermined half cycle of said switching voltage to said base and block the other half cycle of said voltage, and a second unidirectional valve having high forward conductance connected intermediate said base and said collector, said second valve being polarized to provide a low impedance path between said base and collector in response to said other half cycle of said switching voltage.

8. In a switching circuit, a transistor having emitter, collector, and base electrodes, a signal source connected intermediate said emitter and collector, circuit means for coupling an alternating-current switching voltage intermediate said base and one of said other electrodes, a first unidirectional current valve having high back resistance connected intermediate said coupling circuit means and said base, said valve being poled to couple one predetermined half cycle of said switching voltage to said base and block the other half cycle of said voltage, a second unidirectional valve having high forward conductance connected intermediate said base and said one of said other electrodes, said second valve being poled to provide a low impedance path between said base and said one of said other electrodes in response to said other half cycle of said switching voltage, output terminals connected intermediate said emitter and collector, an impedance in series circuit with said output terminals and said transistor, and means for developing a voltage across said impedance equal and opposite to the voltage drop between said emitter and collector during said one predetermined half cycle of said alternating-current switching signal.

9. In a switching circuit, a transistor having emitter, collector, and base electrodes, a signal source connected intermediate said emitter and collector, an alternating-current switching source, a first diode connected intermediate one side of said switching source and said base electrode in a polarity sense to permit said transistor to conduct in response to one half cycle of said alternating-current switching source input, a second diode connected intermediate said base electrode and one of said other electrodes in a polarity sense to provide a low impedance path in response to the other half cycle of said alternating-current source input, the other side of said switching source being coupled to said one of said other electrodes, output terminals connected intermediate said transistor emitter and collector electrodes, and means for developing a voltage output equal and opposite in polarity to the voltage drop between said emitter and collector electrodes during said one half cycle, said voltage output being fed intermediate one of said emitter and collector electrodes and one of said output terminals.

10. The device recited in claim 9 wherein said means for developing a voltage output equal and opposite in polarity to the voltage drop between said emitter and collector electrodes comprises means for manually varying said voltage output, and means for varying said voltage output in response to temperature variations.

11. The device recited in claim 10 wherein said means for varying said voltage output in response to temperature variations comprises a diode having a temperature current variation characteristic similar to that of said transistor, a direct-current source connected intermediate the anode and cathode of said diode, and an impedance connected in series circuit with said direct-current source and said diode whereby said voltage output varies in response to the voltage drop across said diode.

12. In a switching circuit, a transistor having emitter, collector, and base electrodes, a signal source connected intermediate said emitter and collector, an input transformer having one primary and first and second secondary windings, an alternating-current switching source connected across said primary winding, a first diode connected intermediate one end of said first secondary winding and said transistor base electrode in a polarity sense to permit said transistor to conduct in response to one predetermined half cycle of said switching source input, a second diode connected intermediate said base electrode and one of said other electrodes in a polarity sense to provide a low impedance path in response to the other half cycle of said switching source input, the other end of said first secondary winding being commonly connected to one end of said second secondary and the connection between said second diode and said one of said other electrodes, the other end of said second secondary having an in-phase relationship with said one end of said first secondary, a third diode connected intermediate said other end of said second secondary winding and one side of said signal source in a polarity sense to become conductive in response to said one half cycle of said switching input, and a variable impedance connected intermediate said one of said other electrodes and said one side of said signal source.

13. In a switching circuit, a transistor having emitter, collector, and base electrodes, a signal source connected intermediate said emitter and collector, an input transformer having a primary winding and a center tapped secondary winding, an alternating-current switching source connected across said primary winding, said center tap of said secondary winding being grounded, a first diode connected intermediate one end of said secondary winding and said transistor base electrode in a polarity sense to permit said transistor to conduct in response to one predetermined half cycle of said switching source input, a second diode connected intermediate said base electrode and one of said other electrodes in a polarity sense to provide a low impedance path in response to the other half cycle of said switching source input, a third diode connected intermediate the other end of said secondary and said one of said other transistor electrodes in a polarity sense to provide a low impedance path in response to said one predetermined half cycle of said switching source input, a fourth diode connected intermediate said one of said other transistor electrodes and one side of said signal source in a polarity sense to provide a low impedance path in response to said other half cycle of said switching source input, and a variable impedance connected intermediate said one of said other electrodes and said one side of said signal source.

14. In combination with a low level signal transfer circuit having an input and an output between which a signal is transferred, a transistorized switch comprising a transistor having a pair of switching terminals coupled across said output and a control terminal, switching means coupled with said transistor for driving said transistor between conditions of conduction and cutoff, said transistor inherently generating error signals across said output during conduction and cutoff conditions, unidirectional means providing a low impedance path between said control terminal and one of said switching terminals during said cutoff condition, and means for generating in series with said switching terminals a signal poled to oppose said conduction condition error signal.

References Cited in the file of this patent

UNITED STATES PATENTS

| | | |
|---|---|---|
| 2,670,445 | Felker | Feb. 23, 1954 |
| 2,802,071 | Lin | Aug. 6, 1957 |
| 2,802,118 | Simkins | Aug. 6, 1957 |
| 2,809,303 | Collins | Oct. 8, 1957 |
| 2,820,199 | Greefkes | Jan. 14, 1958 |
| 2,863,123 | Koch | Dec. 2, 1958 |

UNITED STATES PATENT OFFICE

CERTIFICATE OF CORRECTION

Patent No. 3,003,122 October 3, 1961

Francis H. Gerhard

It is hereby certified that error appears in the above numbered patent requiring correction and that the said Letters Patent should read as corrected below.

Column 2, line 47, for "0.1" read -- .01 --.

Signed and sealed this 24th day of April 1962.

(SEAL)
Attest:

ESTON G. JOHNSON
Attesting Officer

DAVID L. LADD
Commissioner of Patents